(12) United States Patent
Lepping et al.

(10) Patent No.: US 6,169,665 B1
(45) Date of Patent: Jan. 2, 2001

(54) HIGH-FREQUENCY SHIELDING ARRANGEMENT FOR AN ELECTRICAL CIRCUIT

(75) Inventors: Juergen Lepping, Essen; Achim Soelter, Bocholt, both of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/099,378

(22) Filed: Jun. 18, 1998

(30) Foreign Application Priority Data

Jun. 18, 1997 (DE) .......................................... 297 10 640 U

(51) Int. Cl.⁷ ...................................................... H05K 9/00
(52) U.S. Cl. ......................... 361/800; 361/801; 361/816; 174/35 R; 206/719
(58) Field of Search .................................. 361/752, 796, 361/800, 816, 818, 801; 174/35 R, 35 GC; 211/41.17; 206/719

(56) References Cited

U.S. PATENT DOCUMENTS 5,774,344 * 6/1998 Casebolt .............................. 361/800

FOREIGN PATENT DOCUMENTS

| 93 18 909 U | 5/1995 | (DE) . |
| 295 15 383 | 1/1996 | (DE) . |

* cited by examiner

*Primary Examiner*—Jayprakash N. Gandhi
(74) *Attorney, Agent, or Firm*—Schiff Hardin & Waite

(57) ABSTRACT

A shielding arrangement for electrical circuits, particularly on printed circuit boards, has a shielding frame with circumferentially arranged cupola-like pegs for engagement with catches in a shield cover. The spacing between the pegs is determined by the required HF-tightness.

6 Claims, 1 Drawing Sheet

HIGH-FREQUENCY SHIELDING ARRANGEMENT FOR AN ELECTRICAL CIRCUIT

BACKGROUND OF THE INVENTION

1. Field of the Invention

The present invention is directed to a shielding arrangement of the type suitable for high-frequency shielding of an electrical circuit.

2. Description of the Prior Art

Shielded housings in different forms are employed for shielding against high-frequency radiation or emission to and from electrical circuits. Such noise emission leads to the upward transgression of various limit values of components and to malfunctions of the device. The interference of the transmission energy in sensitive circuit parts in the case of a mobile radiotelephone device is especially problematical. Further, shielding the emission of harmonics from internal oscillator and amplifier stages at extremely high frequencies of 5 through 10 gigahertz is thereby extremely critical.

In conventional printed circuit board manufacture, a shielding frame is first soldered to or screwed on a circuit board or other supporting structure for a circuit which is to be shielded, and a sheet metal part is then pressed onto this frame in a second step. Attempts are made, in particular, to achieve a good shielding with a claw-type connection of the shield cover to the outside wall surfaces of the shielding frame. Soldering of the complete shielding, screwing the shield well to the printed circuit board or gluing with conductive glue would, for example, be conceivable as further possible solutions. These solutions, however, are very cost-intensive.

In mass-produced products, for example given mobile radiotelephone devices, a uniformly good contact of the shielding frame with the shield cover cannot always be guaranteed due to the tolerance of the shielding as well as of the printed circuit board. Moreover, the correct seating of the shielding is difficult to recognize optically because of the laterally overlapping cover.

SUMMARY OF THE INVENTION

An object of the present invention is to provide a shielding arrangement for an electrical circuit that exhibits good tightness against HF radiation and which can be economically manufactured.

The above object is achieved in accordance with the principles of the present invention in a shielding arrangement for an electrical circuit, such as a printed circuit board, having a shielding frame adapted to surround the printed circuit board, the shielding frame carrying a number of cupola-like pegs projecting therefrom, at least around its circumference, these pegs engaging with catches, disposed in registration with the pegs, in a shield cover which fits over the frame. The spacing between the pegs on the shielding frame is determined by the required HF-tightness.

The shielding frame may have inner walls which extend between circumferential walls, and these inner walls may carry cupola-like pegs thereon as well.

As used herein, the description "cupola-like" means that each peg has a base part and a tapered free end. The base part may, for example, have a polygonal cross section, as viewed from above, and the tapered free end can be in the form of a pyramid having faces equal in number to the number of faces of the polygonal base part. For example, the base part can have four sides, such as configured in a square, and the tapered free end will then be a four-sided pyramid.

An optical check for HF-tightness can be easily implemented given the inventive shielding.

DESCRIPTION OF THE PREFERRED EMBODIMENTS

Figure 1A:
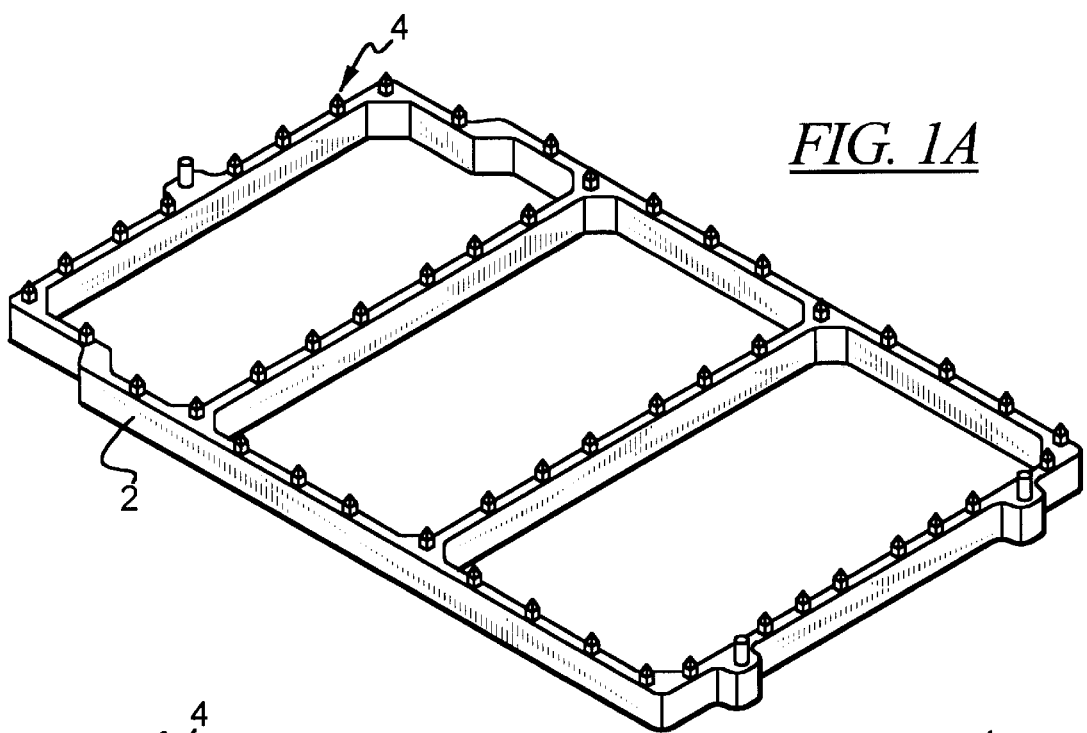
FIG. 1A shows a frame forming a component of a shielding arrangement constructed in accordance with the principles of the present invention.
Figure 1B:
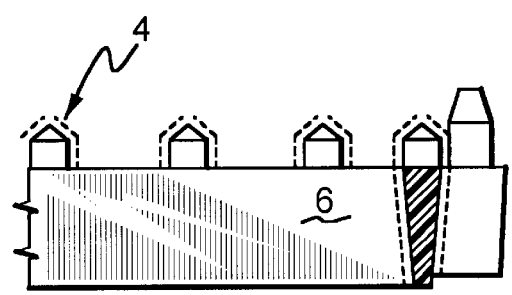
FIG. 1B shows in a side view an enlarged detail of a portion of the frame of FIG. 1A.
Figure 1D:
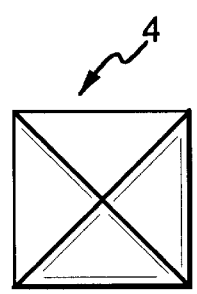
FIG. 1D is a plan view of one of the pegs of FIG. 1B.
Figure 1C:
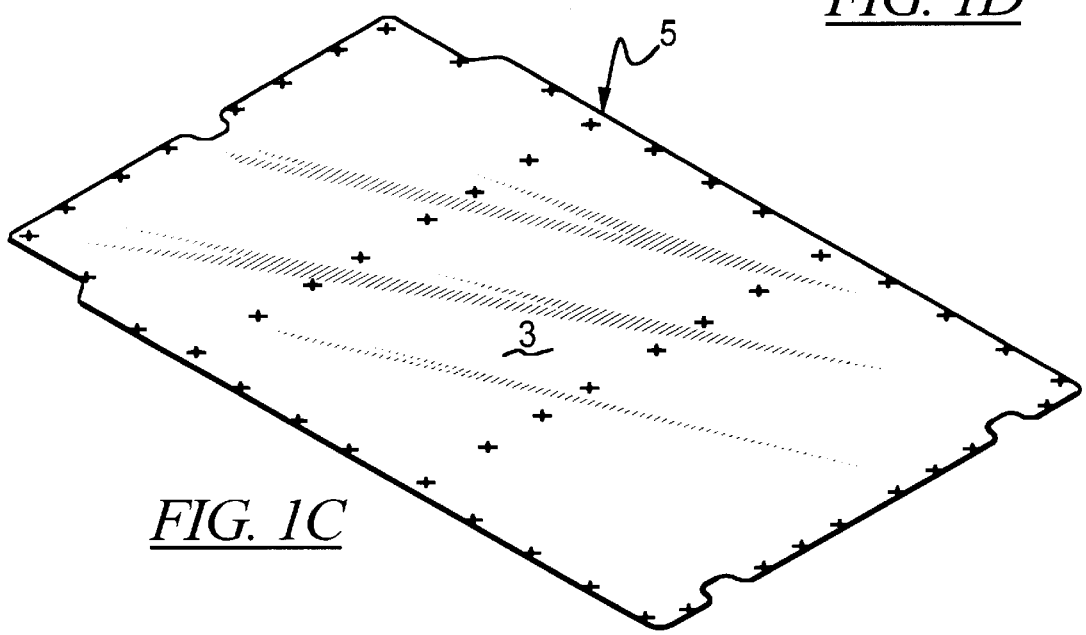
FIG. 1C shows a cover forming a further component of the shielding arrangement constructed in accordance with the principles of the present invention.

The inventive shielding arrangement includes a shielding frame 2 (FIGS. 1A and 1B and 1D) to which a shield cover 3 (FIG. 1C) is secured.

The shielding frame 2 has a number of cupola-like pegs 4 distributed around its circumference that engage into catches 5 of the shield cover 3. The catches 5 in the shield cover 3 are each formed by intersecting cuts or recesses, generally in the form of an X, in the shield cover 3. The shield cover 3 is composed of a material having a certain degree of natural stiffness, so that when the shield cover 3 is fitted over the cupola-like pegs 4, the pegs 4 respectively force their way through the catches 5, and the cover 3 is held in place at each peg-and-catch combination by the natural stiffness of the material of the cover 3 forcing itself against the respective pegs 4.

The shielding frame 2 and the shield cover 3 are each composed of electrically conductive material.

The pegs 4 are preferably arranged at at least one side of the shielding frame 2. They can also be provided on shield walls 6 arranged within the outer circumference of the shielding frame 2.

In order to assure good HF-tightness, the shield cover 3 must be good electrical contact with the shielding frame 2. The spacing between the contacts is dependent on the frequency to be shielded.

Regions with especially sensitive circuit parts or regions with extremely high-energy HF emission are inventively provided with contacts spaced more closely together than the comparatively uncritical regions. The structural outlay can be reduced as a result. As a result of this procedure, the necessary contact pressure when applying the cover 3 onto the frame 2 is reduced.

A faultless contact to the cover 3 can be produced by the circumferential pegs 4 located on the frame 2. Since the cover 3 has no lateral, bent edges, the faultless seating of the cover on the frame 2 can be easily optically recognized.

Although modifications and changes may be suggested by those skilled in the art, it is the intention of the inventors to embody within the patent warranted hereon all changes and modifications as reasonably and properly come within the scope of their contribution to the art.

We claim as our invention:

1. A shielding arrangement for an electrical circuit comprising:
   a shielding frame, composed of electrically conductive material, having a circumference adapted to surround an electrical circuit;
   a plurality of cupola-like pegs disposed on at least one side of said shielding frame and projecting therefrom, said pegs being respectively spaced apart on said shielding frame by distances determined by a required HF-tightness; and a shield cover composed of electrically conductive material having a plurality of catches therein, in registration with said pegs, press fit onto said shielding frame with said pegs projecting through said catches, each of said catches having flexible flaps which frictionally engage respective pegs in the catches to produce said press fit.

2. A shielding arrangement as claimed in claim 1 wherein said shielding frame has a circumferential wall, defining said circumference, and at least one interior wall extending between portions of said circumferential wall, said interior wall also having a plurality of said cupola-like pegs on at least one side thereof, and said shield cover having catches in registration with said pegs on said interior wall.

3. A shielding arrangement as claimed in claim 1 wherein said cupola-like pegs each comprise a base portion and a tapering free end disposed on said base portion.

4. A shielding arrangement as claimed in claim 1 wherein said base portion comprises a polygon having a plurality of faces, and wherein said tapering portion comprises a pyramid having a plurality of faces equal in number to the plurality of faces of said base.

5. A shielding arrangement as claimed in claim 4 wherein said base portion and said tapering portion each have four faces, and wherein said tapering portion comprises a four-sided pyramid.

6. A shielding arrangement as claimed in claim 4 wherein said catches in said shield cover each comprise a pair of intersecting linear openings in the shape of an X.

* * * * *